US008889562B2

(12) United States Patent
Cheng et al.

(10) Patent No.: US 8,889,562 B2
(45) Date of Patent: Nov. 18, 2014

(54) DOUBLE PATTERNING METHOD

(75) Inventors: Kangguo Cheng, Schenectady, NY (US); Bruce B. Doris, Brewster, NY (US); Ali Khakifirooz, Mountain View, CA (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/555,306

(22) Filed: Jul. 23, 2012

(65) Prior Publication Data

US 2014/0024215 A1 Jan. 23, 2014

(51) Int. Cl.
*H01L 21/302* (2006.01)

(52) U.S. Cl.
USPC ........... 438/705; 438/704; 438/753; 438/924; 438/942; 216/41; 216/48; 216/51; 216/57; 216/62; 216/87; 216/99

(58) Field of Classification Search
CPC ............ Y10S 438/924; Y10S 438/947; H01L 21/3213; H01L 21/32134; H01L 21/3215; H01L 21/32155; H01L 21/30604; H01L 21/0338; H01L 21/31144; H01L 21/3088
See application file for complete search history.

(56) References Cited

U.S. PATENT DOCUMENTS

| 6,987,051 | B2 | 1/2006 | Schwarzenbach et al. |
| 7,190,049 | B2 | 3/2007 | Tuominen et al. |
| 7,737,049 | B2 | 6/2010 | Manger et al. |
| 8,003,455 | B2 | 8/2011 | Cheng et al. |
| 2002/0001960 | A1* | 1/2002 | Wu et al. ........................ 438/705 |
| 2005/0285176 | A1 | 12/2005 | Kim |
| 2008/0203055 | A1 | 8/2008 | Kamins et al. |
| 2009/0033362 | A1 | 2/2009 | Manger et al. |
| 2010/0187658 | A1 | 7/2010 | Wei |
| 2010/0233871 | A1 | 9/2010 | Chuang et al. |
| 2011/0070739 | A1* | 3/2011 | Cheng et al. .................. 438/705 |
| 2012/0040512 | A1 | 2/2012 | Li et al. |

FOREIGN PATENT DOCUMENTS

EP          0 122 662 A1    10/1984

* cited by examiner

*Primary Examiner* — Lan Vinh
*Assistant Examiner* — Jiong-Ping Lu
(74) *Attorney, Agent, or Firm* — Gibb & Riley, LLC; Joseph P. Abate, Esq.

(57) ABSTRACT

Disclosed is an improved double patterning method for forming openings (e.g., vias or trenches) or mesas on a substrate. This method avoids the wafer topography effects seen in prior art double patterning techniques by ensuring that the substrate itself is only subjected to a single etch process. Specifically, in the method, a first mask layer is formed on the substrate and processed such that it has a doped region and multiple undoped regions within the doped region. Then, either the undoped regions or the doped region can be selectively removed in order to form a mask pattern above the substrate. Once the mask pattern is formed, an etch process can be performed to transfer the mask pattern into the substrate. Depending upon whether the undoped regions are removed or the doped region is removed, the mask pattern will form openings (e.g., vias or trenches) or mesas, respectively, on the substrate.

19 Claims, 17 Drawing Sheets

DOUBLE PATTERNING METHOD

BACKGROUND

1. Field of the Invention

The present disclosure relates to techniques for forming structures on a substrate, and more specifically, to embodiments of an improved double patterning method for forming openings (e.g., vias or trenches) or mesas (e.g., three dimensional bodies, pillars, bars, etc.) on a substrate.

2. Description of the Related Art

As semiconductor device size scaling continues, the ability to form devices or components thereof with small dimensions has become more and more challenging. One solution for achieving high resolution is double patterning. Conventional double patterning involves double exposure and double etch (DPDE) process. That is, a first mask is formed using conventional lithographic patterning techniques followed by a first etch process. Then, a second mask is formed using conventional lithographic patterning techniques followed by a second etch process. Unfortunately, the wafer topography after the first etch processes may negatively impact the formation of the second mask convention due to reduced depth focus and result in overlay errors. Therefore, there is a need in the art for an improved double patterning technique that avoids such wafer topography effects.

SUMMARY

In view of the foregoing, disclosed herein are embodiments of an improved double patterning method for forming openings (e.g., vias or trenches) or mesas (e.g., three dimensional bodies, pillars, bars, etc.) on a substrate. This method avoids the wafer topography effects seen in prior art double patterning techniques by ensuring that the substrate itself is only subjected to a single etch process. Specifically, in the embodiments disclosed herein, a first mask layer is formed on the substrate and subjected to multiple masked implantation processes such that it has a doped region and multiple undoped regions within (i.e., defined by) the doped region. Then, either the undoped regions or the doped region can be selectively removed in order to form a mask pattern above the substrate. Once the mask pattern is formed, an etch process can be performed to transfer the mask pattern into the substrate. Depending upon whether the undoped regions are removed or the doped region is removed, the mask pattern will form openings or mesas, respectively, on the substrate.

Generally, each of the method embodiments disclosed herein can comprise providing a substrate. This substrate can comprise any material requiring patterning. A first mask layer (e.g., an amorphous semiconductor layer or a polycrystalline semiconductor layer, such as an amorphous silicon layer or a polycrystalline silicon layer) can be formed on the substrate. Then, at least two masked dopant implantation processes can be performed in order to form, within the first mask layer, a doped region that laterally surrounds multiple undoped regions. Next, either the undoped regions or the doped region of the first mask layer can be selectively removed in order to form a mask pattern directly above the substrate. Once the mask pattern is formed, a single etch process can be performed in order to transfer the mask pattern into the substrate, thereby forming either openings (e.g., vias or trenches) or mesas (e.g., three dimensional bodies, pillars, bars, etc.) in the substrate.

In each of the embodiments disclosed herein, the masked dopant implantation processes can comprise first forming a second mask layer on the first mask layer. This second mask layer can be formed and, particularly, patterned such that first portions of the first mask layer are exposed. A first dopant implantation process can then be performed to dope the first portions of the first mask layer. After the first dopant implantation process, the second mask layer can be removed. Next, a third mask layer can be formed on the first mask layer. This third mask layer can be formed and, particularly, patterned such that second portions of the first mask layer, which traverse the first portions, are exposed. Then, a second dopant implantation process can be performed in order to dope the exposed second portions of the first mask layer. As a result, the doped first portions and the doped second portions, which traverse the first portions, in combination form the doped region that laterally surrounds multiple undoped regions. Once the second dopant implantation process is performed, the third mask layer can be removed.

As mentioned above, in each of the embodiments disclosed herein, either the multiple undoped regions or the doped region of the first mask layer can be selectively removed in order to form a mask pattern directly above the substrate. Depending upon whether the undoped regions are removed or the doped region is removed, this mask pattern can be used during a single etch process to form either openings (e.g., vias or trenches) or mesas (e.g., three dimensional bodies, pillars, bars, etc.), respectively, on the substrate. To optimize the selective removal process, the dopant used in the dopant implantation processes described above can be pre-selected to facilitate either selective removal of the undoped regions over the doped region for subsequent formation of openings (e.g., vias or trenches) in the substrate or selective removal of the doped region for subsequent formation of mesas (e.g., three dimensional bodies, pillars, bars, etc.) in the substrate.

For example, in one embodiment, the patterning method can comprise providing a substrate. This substrate can comprise any material requiring patterning. A first mask layer can be formed on the substrate. Then, at least two masked dopant implantation processes can be performed in order to form, within the first mask layer, a doped region, which laterally surrounds multiple undoped regions. Next, the multiple undoped regions can be selectively removed in order to form a mask pattern above the substrate. In this case, the dopant used in the dopant implantation processes to form the doped region should be preselected to ensure that the undoped regions can be selectively etched over the doped region. For example, when the first mask layer comprises an amorphous or polycrystalline silicon layer, boron or xenon can be preselected as the dopant to be used in the dopant implantation processes because undoped silicon can be readily selectively etched over boron-doped or xenon-doped silicon. Once the mask pattern is formed, a single etch process can be performed in order to transfer the mask pattern into the substrate, thereby forming openings (e.g., vias or trenches) in the substrate.

In another embodiment, the patterning method can comprise providing a substrate. Again, this substrate can comprise any material requiring patterning. A first mask layer can be formed on the substrate. Then, at least two masked dopant implantation processes can be performed in order to form, within the first mask layer, a doped region, which laterally surrounds multiple undoped regions. Next, the doped region can be selectively removed in order to form a mask pattern above the substrate. In this case, the dopant used in the dopant implantation processes to form the doped region should be preselected to ensure that the doped region can be selectively etched over the undoped regions. For example, when the first mask layer comprises an amorphous or polycrystalline silicon layer, arsenic or phosphorous can be preselected as the dopant to be used in the dopant implantation processes because arsenic-doped or phosphorous-doped silicon can be readily selectively etched over undoped silicon. Once the mask pattern is formed, a single etch process can be performed in order to transfer the mask pattern into the substrate, thereby forming mesas (e.g., three dimensional bodies, pillars, bars, etc.) in the substrate.

Also disclosed herein are embodiments of a computer program product. This computer program product can comprise a computer-readable medium having computer-readable program code embodied therewith. The computer-readable program code can comprise instructions that, when executed by a computer, control the manufacturing equipment (e.g., lithography equipment, implantation chambers, etch chambers, etc.) used in the manufacturing of integrated circuits and, more specifically, cause such manufacturing equipment to perform the above-described method.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, as semiconductor device size scaling continues, the ability to form devices or components thereof with small dimensions has become more and more challenging. One solution for achieving high resolution is double patterning. Conventional double patterning involves double exposure and double etch (DPDE) process. That is, a first mask is formed using conventional lithographic patterning techniques followed by a first etch process. Then, a second mask is formed using conventional lithographic patterning techniques followed by a second etch process. Unfortunately, the wafer topography after the first etch processes may negatively impact the formation of the second mask convention due to reduced depth focus and result in overlay errors. Therefore, there is a need in the art for an improved double patterning technique that avoids such wafer topography effects.

In view of the foregoing, disclosed herein are embodiments of an improved double patterning method for forming openings (e.g., vias or trenches) or mesas (e.g., three dimensional bodies, pillars, bars, etc.) on a substrate. This method avoids the wafer topography effects seen in prior art double patterning techniques by ensuring that the substrate itself is only subjected to a single etch process. Specifically, in the embodiments disclosed herein, a first mask layer is formed on the substrate and subjected to multiple masked implantation processes such that it has a doped region and multiple undoped regions within (i.e., defined by) the doped region. Then, either the undoped regions or the doped region can be selectively removed in order to form a mask pattern above the substrate. Once the mask pattern is formed, an etch process can be performed to transfer the mask pattern into the substrate. Depending upon whether the undoped regions are removed or the doped region is removed, the mask pattern will form openings or mesas, respectively, on the substrate.

Figure 1:
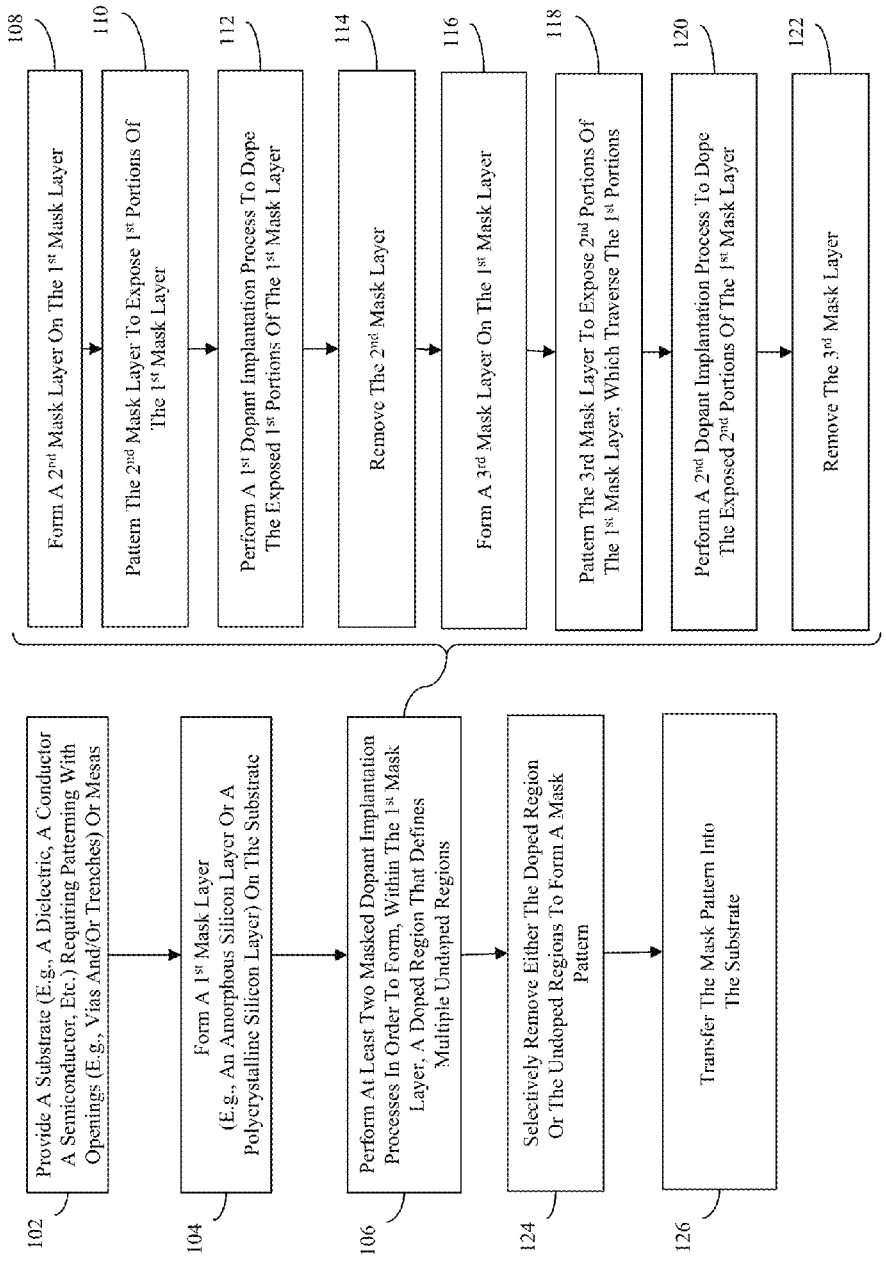
FIG. 1 is a flow diagram illustrating an embodiment of a patterning method.
Figure 2:
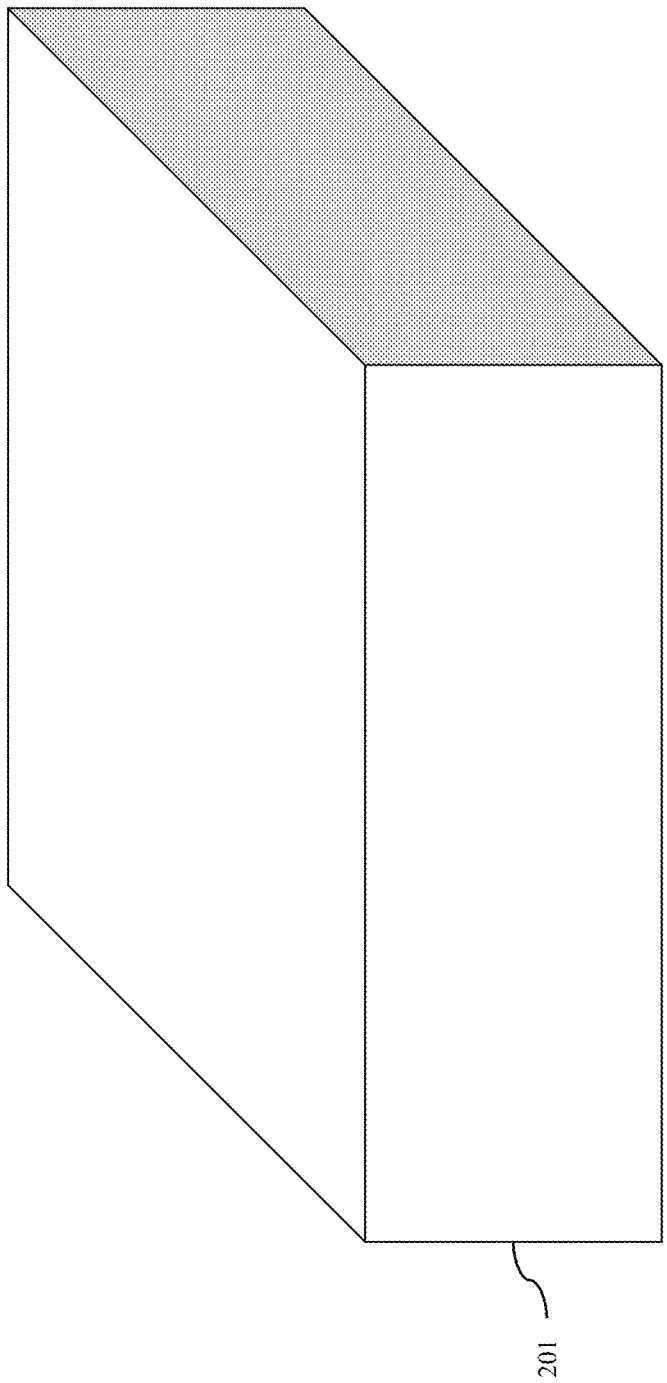
FIG. 2 is a perspective diagram illustrating a substrate to be patterned using the patterning method set forth in the flow diagram of FIG. 1.

Referring to the flow diagram of FIG. 1, generally, each of the method embodiments disclosed herein can comprise providing a substrate 201 (102, see FIG. 2). This substrate 201 can comprise any material layer requiring patterning with openings (e.g., vias or trenches), mesas (i.e., three dimensional bodies, pillars, bars, etc.), or any other patterns. For example, the substrate 201 can comprise a bulk semiconductor substrate (e.g., a bulk silicon substrate or any other bulk semiconductor substrate) requiring patterning with trenches for subsequent formation of trench isolation structures (e.g., shallow trench isolation structures and/or deep trench isolation structures). Alternatively, the substrate 201 can comprise a semiconductor layer or conductor layer above a semiconductor substrate and requiring patterning with mesas for subsequent formation of, for example, vertical nanowires or gate structures. Alternatively, the substrate 201 can comprise a dielectric layer, such as a back end of the line (BEOL) dielectric layer, requiring patterning with vias for subsequent formation of contacts or interconnects and/or requiring patterning with trenches for subsequent wire formation. It should be understood that the above list of materials requiring pattern is offered for illustration purposes and is not intended to be limiting. The disclosed method could alternatively be implemented for patterning of openings and/or mesas in any other suitable material and/or for any other suitable purpose.

Figure 3:
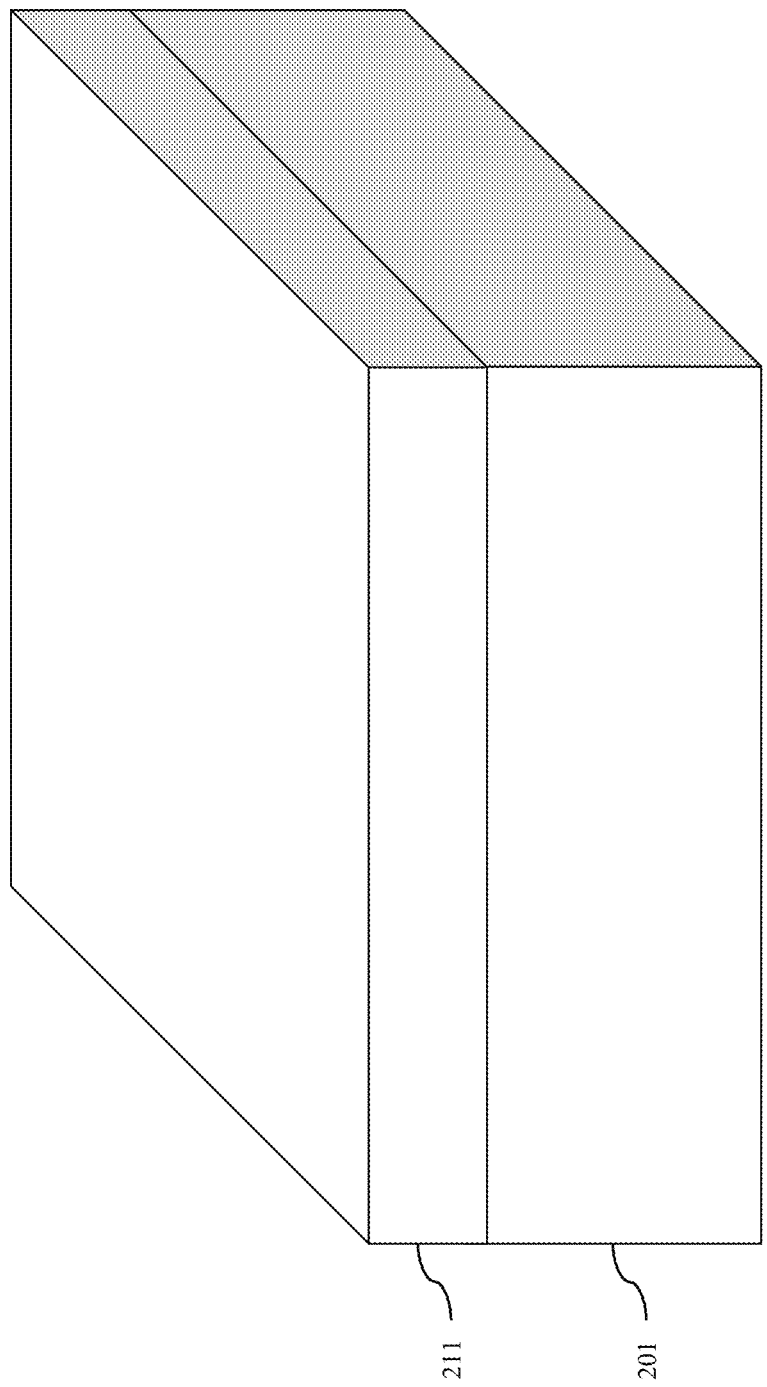
FIG. 3 is a perspective diagram illustrating process 104 of the patterning method of FIG. 1.

In order to pattern this substrate 201, a first mask layer 211 can be formed (e.g., deposited) on the substrate 201 (104, see FIG. 3). This first mask layer 211 can comprise any suitable material within which doped and undoped regions can be formed, as discussed in detail below, and which can be etched to selectively remove either the doped or undoped regions, also as discussed in detail below. For example, the first mask layer 211 can comprise an amorphous semiconductor layer or polycrystalline semiconductor layer, such as an amorphous silicon layer or a polycrystalline silicon layer. Optionally, the first mask layer 211 can be planarized, for example, by chemical mechanical polishing (CMP), to ensure that it has a planar top surface and an essentially uniform thickness.

Figure 4:
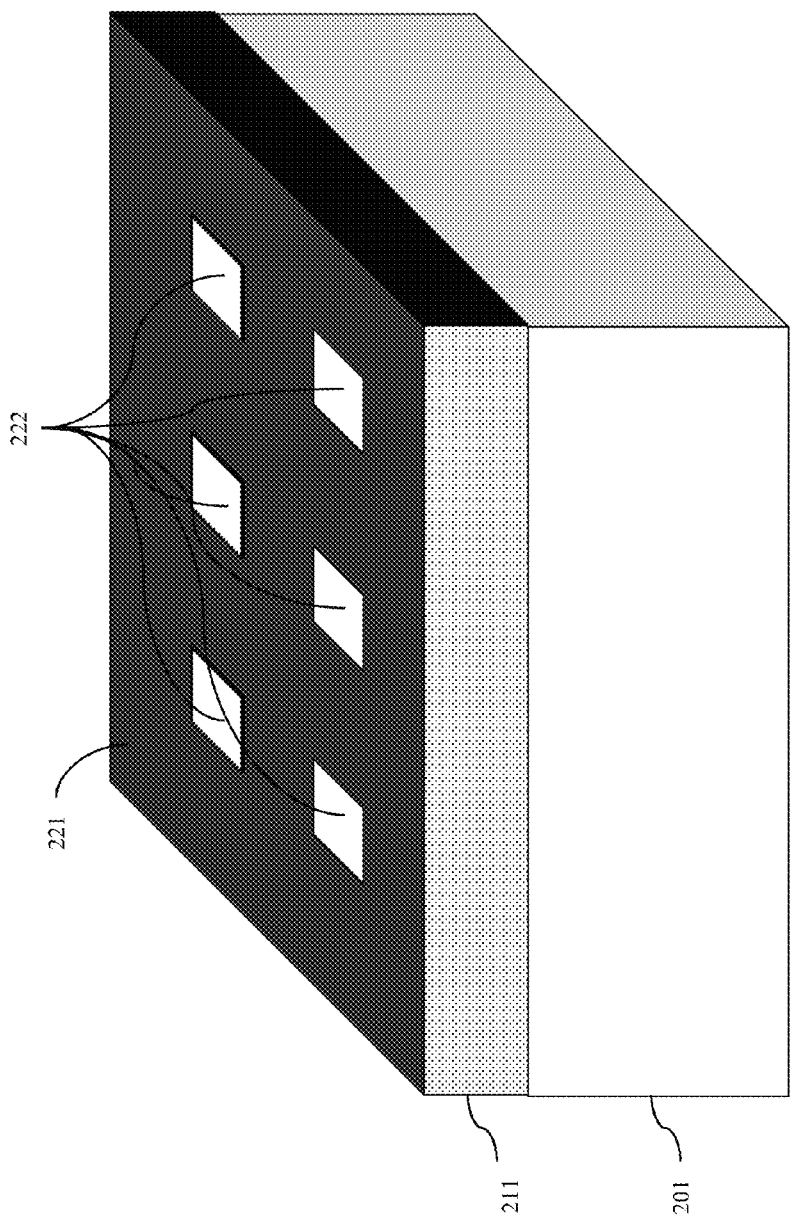
FIG. 4 is a perspective diagram illustrating process 106 of the patterning method of FIG. 1.

Then, at least two masked dopant implantation processes can be performed in order to form, within the first mask layer 211, a doped region 221 that laterally surrounds (i.e., defines the outer edges of, borders, etc.) multiple undoped regions 222 (106, see FIG. 4).

Figure 5:
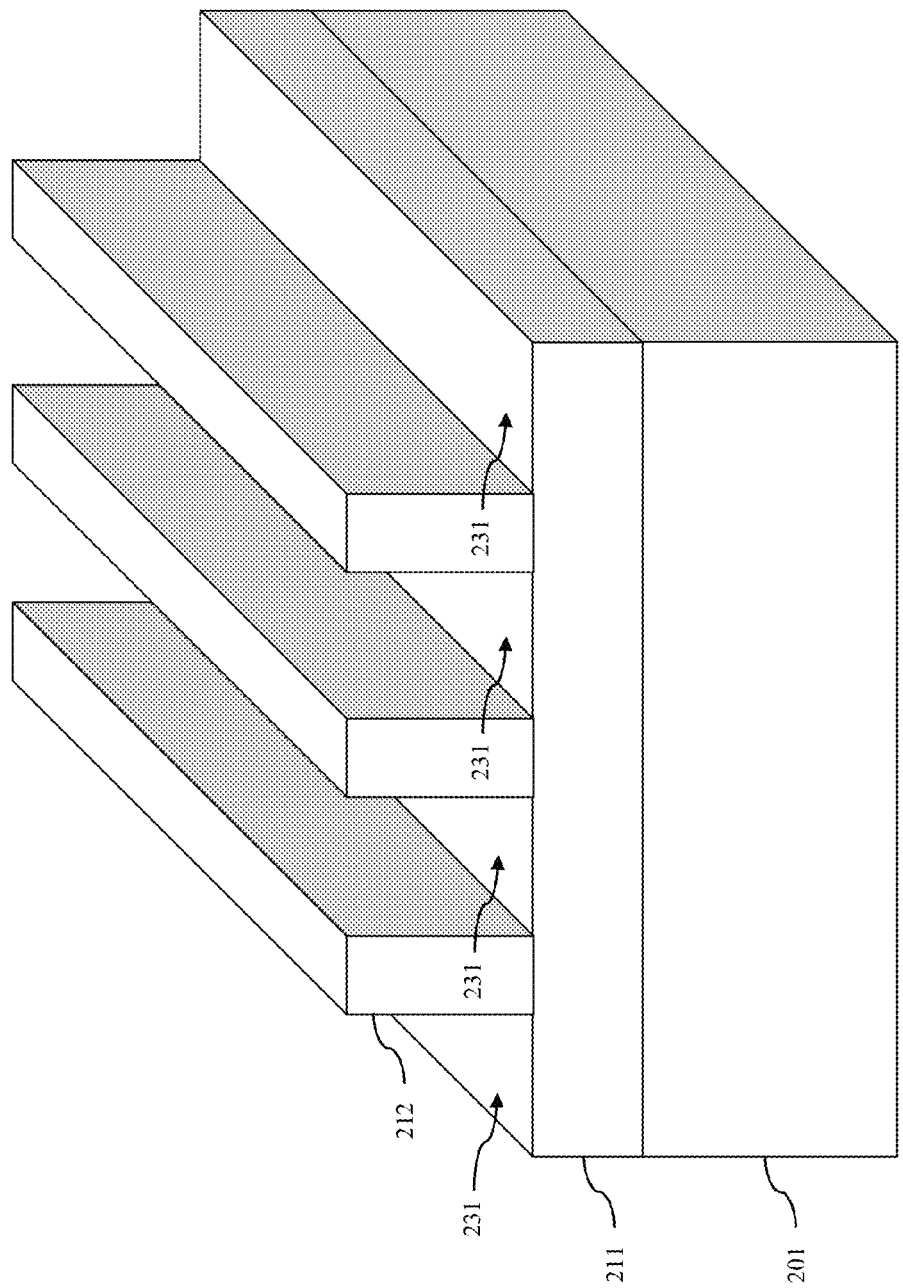
FIG. 5 is a perspective diagram illustrating processes 108-110 of the patterning method of FIG. 1.

Specifically, in each of the embodiments disclosed herein, the masked dopant implantation processes 106 can comprise forming (e.g., depositing) a second mask layer 212 on the first mask layer 211 and, then, patterning the second mask layer 212 such that first portions 231 of the first mask layer 211 are exposed (108-110, see FIG. 5). As illustrated in FIG. 5, in one embodiment, the pattern of the second mask layer can comprise a plurality of parallel rectangular bodies (also referred to herein as a stripe mask pattern), wherein each body has a same width and wherein the spacing between adjacent bodies is essentially identical. However, it should be understood that the pattern of the second mask layer may vary from the exemplary stripe mask pattern illustrated. For example, the spacing between adjacent bodies in the pattern may differ, the widths of the bodies in the pattern may differ, the bodies in the pattern may be non-parallel, the bodies in the pattern may not be rectangular, the bodies in the pattern may not be continuous (e.g., each rectangular body as shown may be replaced with multiple rectangular bodies that are aligned but spaced apart), etc.

Figure 6:
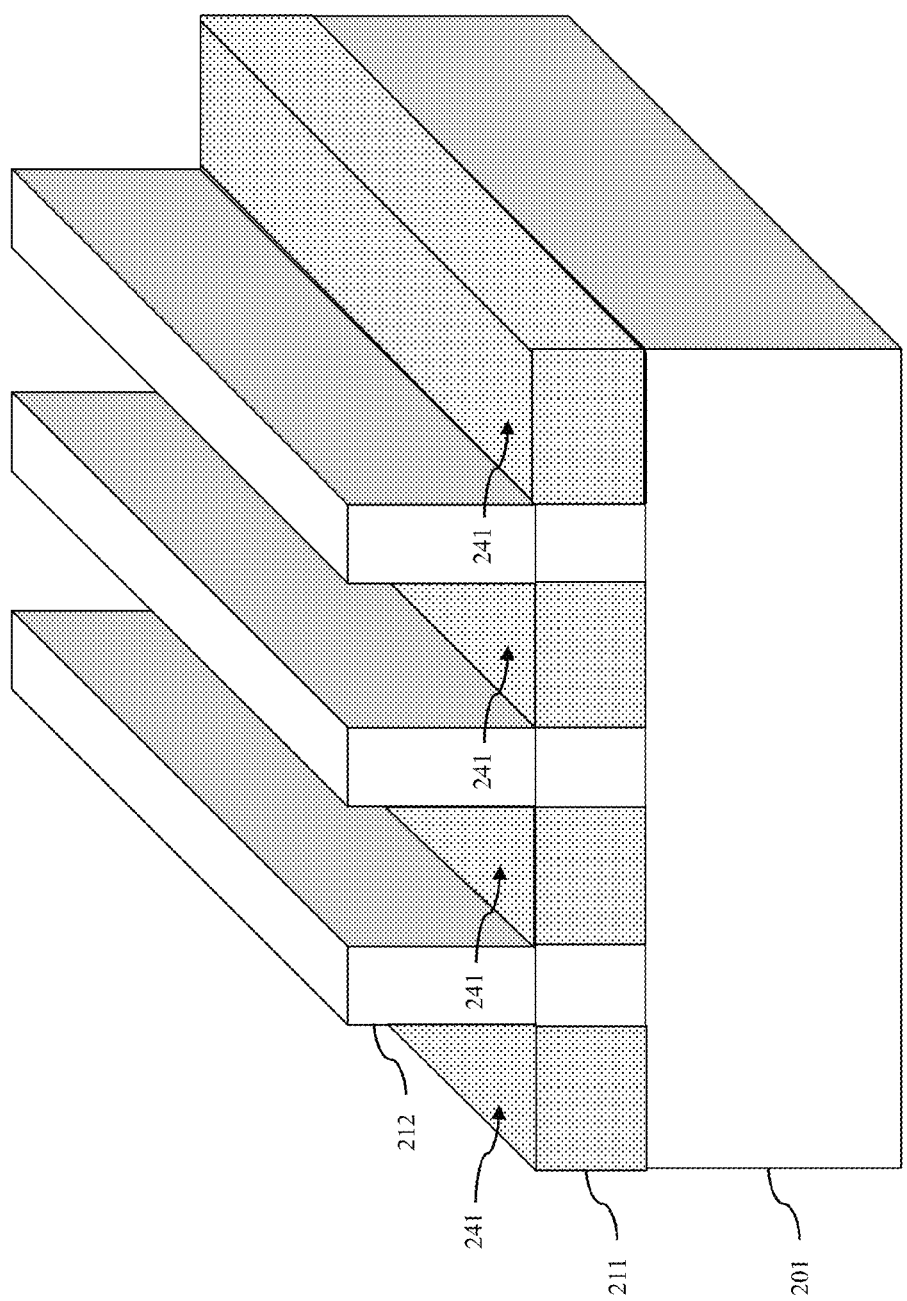
FIG. 6 is a perspective diagram illustrating process 112 in the patterning method of FIG. 1.

A first dopant implantation process can then be performed to dope the exposed first portions 231 of the first mask layer 212 with a dopant, thereby forming doped first portions 241 (112, see FIG. 6). After the first dopant implantation process 112, the second mask layer 212 can be selectively removed (114).

Figure 7:
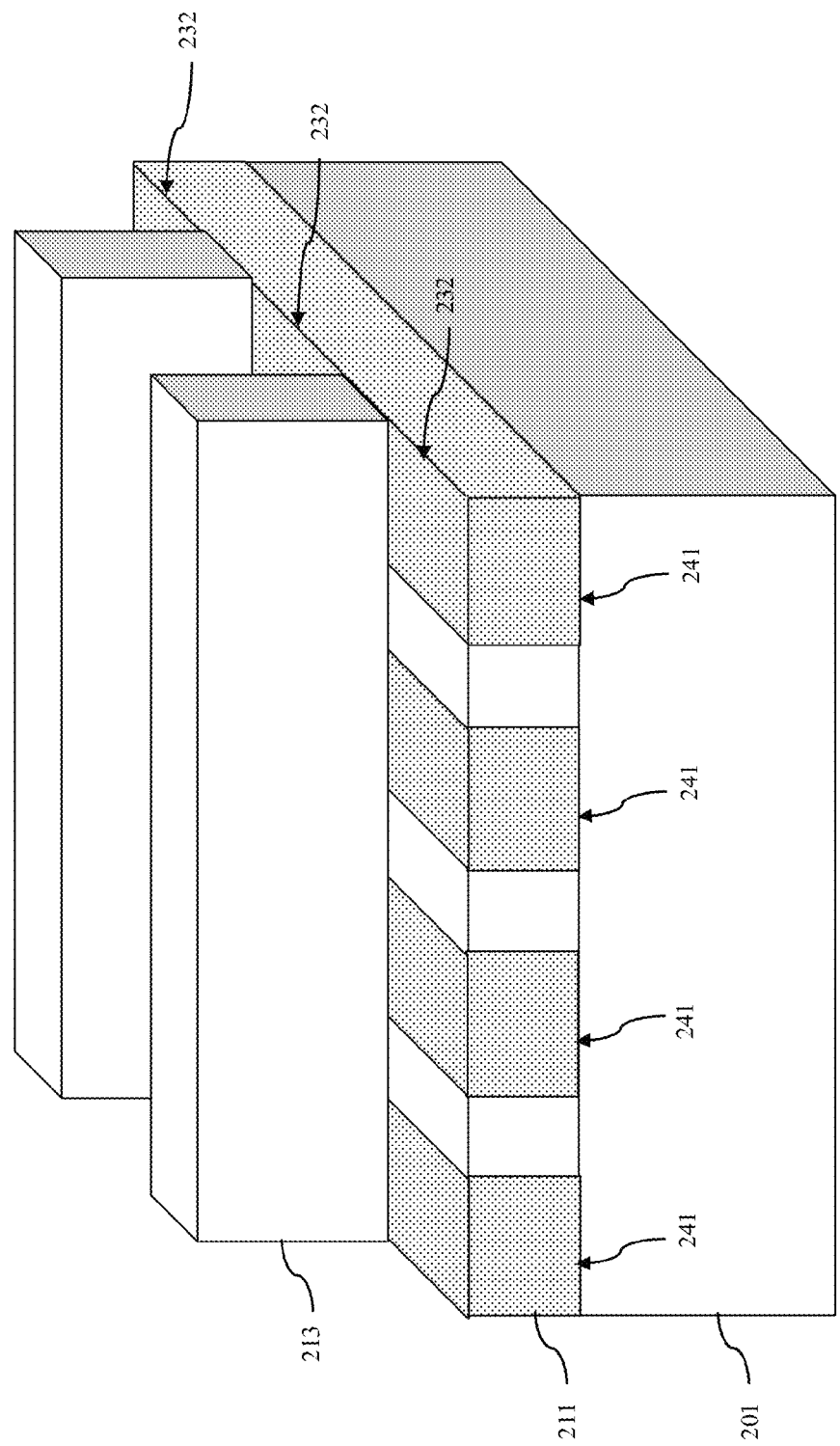
FIG. 7 is a perspective diagram illustrating processes 114-118 in the patterning method of FIG. 1.

Next, a third mask layer 213 can be formed (e.g., deposited) on the first mask layer 211 and, then, patterned so as to expose second portions 231 of the first mask layer 211. Specifically, the third mask layer 213 can be patterned so that the exposed second portions 232 traverse (i.e., cross) the doped first portions 241 (116-118, see FIG. 7). As illustrated in FIG. 7, in one embodiment, the pattern of the third mask layer 213 can, like the pattern of the second mask layer 212, comprise a plurality of parallel rectangular bodies (i.e., can be a stripe mask pattern), wherein each body has a same width and wherein the spacing between adjacent bodies are essentially identical. However, it should be understood that the pattern of the second mask layer may differ from the exemplary pattern illustrated. For example, the spacing between adjacent bodies in the pattern may differ, the widths of the bodies in the pattern may differ, the bodies in the pattern may be non-parallel, the bodies in the pattern may not be rectangular, the bodies in the pattern may not be continuous (e.g., each rectangular body as shown may be replaced with multiple rectangular bodies that are aligned but spaced apart), etc. Also, as illustrated in FIG. 7, the pattern of the third mask layer 213 can be such that the exposed second portions 232 of the first mask layer 211 are perpendicular to the previously doped first portions 241 of the first mask layer 211. Alternatively, the pattern of the third mask layer 213 may be such that the exposed second portions 232 of the first mask layer 211 are not perpendicular to the previously doped first portions 241 (e.g., such that the exposed second portions 232 are angled at a 45 degree angle or some other angle relative to the previously doped first portions 241). Since the third mask layer 213 is formed on the planar surface of the first mask layer 212, topography effects are avoided.

Figure 8:
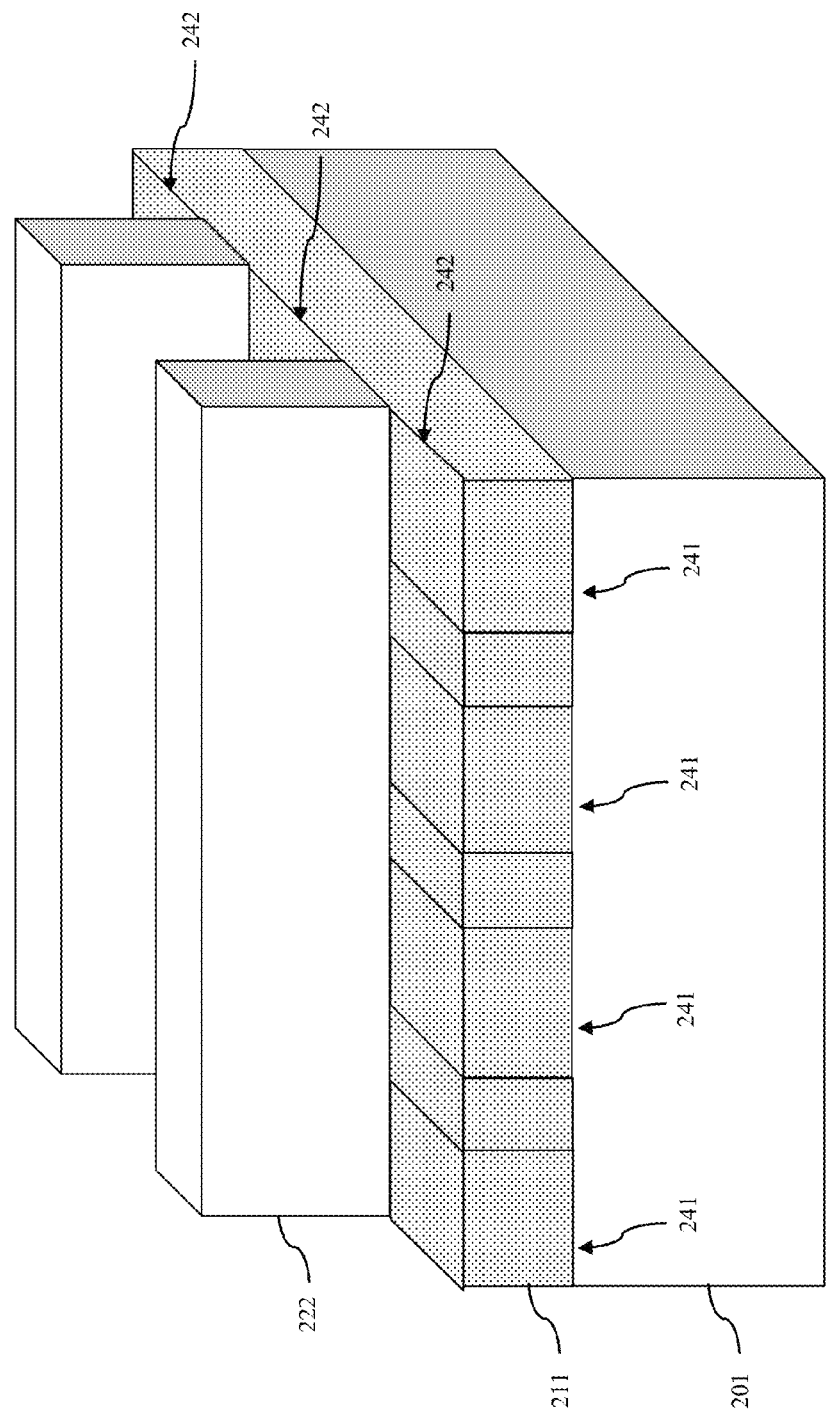
FIG. 8 is a perspective diagram illustrating process 120 in the patterning method of FIG. 1.
Figure 9:
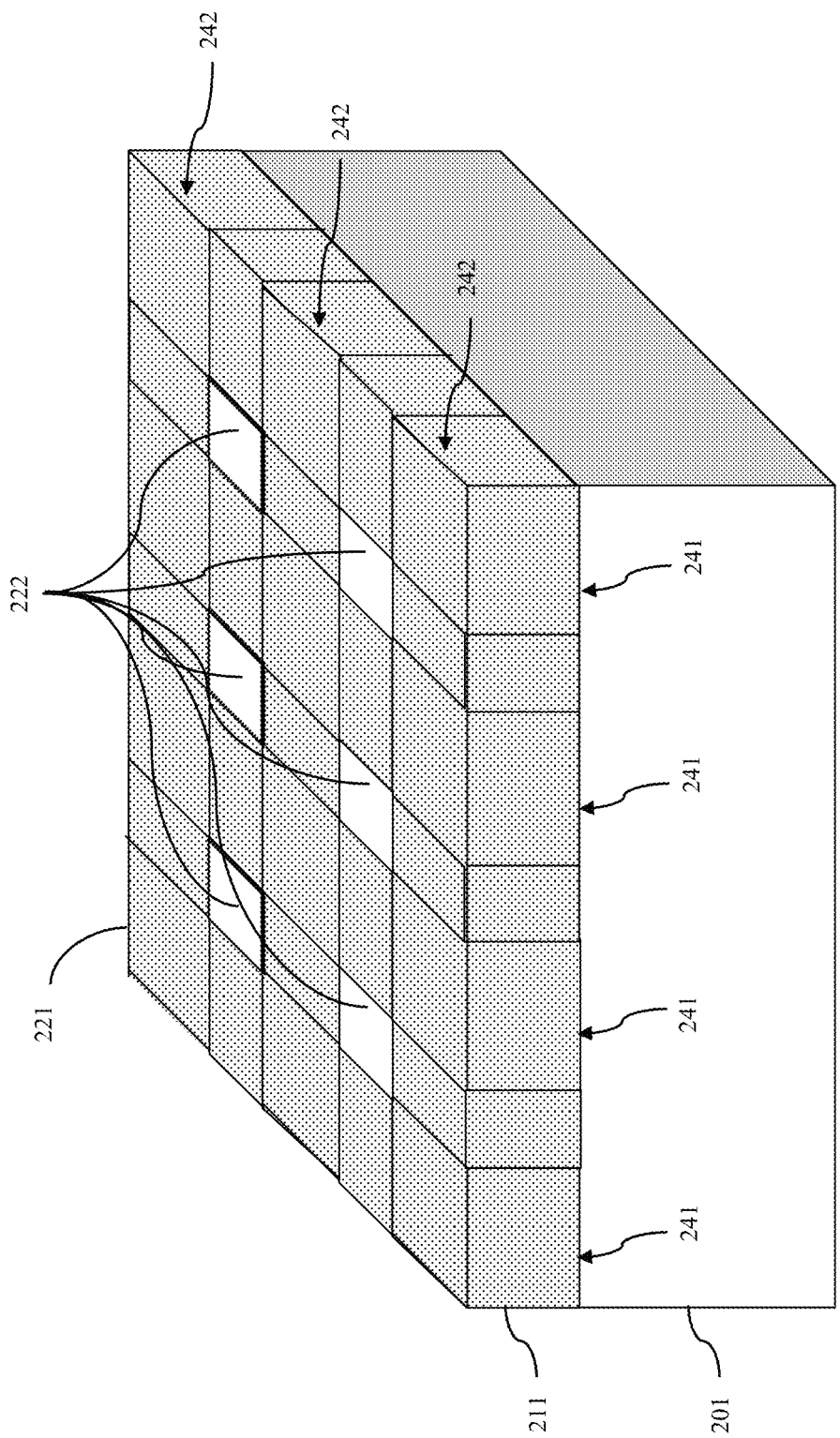
FIG. 9 is a perspective diagram illustrating process 122 in the patterning method of FIG. 1.

Then, a second dopant implantation process can be performed in order to dope the exposed second portions 232 of the first mask layer 211 with the dopant, thereby forming doped second portions 242 (120, see FIG. 8). After the second dopant implantation process 120, the third mask layer 213 can be removed (122, see FIG. 9). As illustrated in FIG. 9, the doped first portions 241 and the doped second portions 242 in combination form the doped region 221 that laterally surrounds (i.e., defines the outer edges of, borders, etc.) multiple undoped regions 222.

It should be noted that patterning of the second mask layer 212 at process 110 and patterning of the third mask layer 213 at process 118 can be achieved through conventional lithographic patterning techniques or, alternatively, can be achieved through conventional sidewall image transfer techniques. Such patterning techniques are well known in the art and, thus, the details thereof are omitted from this specification in order to allow the reader to focus on the salient aspects of the embodiments. Those skilled in the art will recognize that the material used for the second mask layer 212 and the third mask layer 213 may vary depending upon the patterning technique used. For example, if lithographic patterning techniques are used, the second mask layer 212 and third mask layer 213 may comprise photoresist layers; whereas if sidewall image transfer patterning techniques are used, the second mask layer 212 and third mask layer 213 may comprise dielectric layers (e.g., nitride layers).

Figure 10:
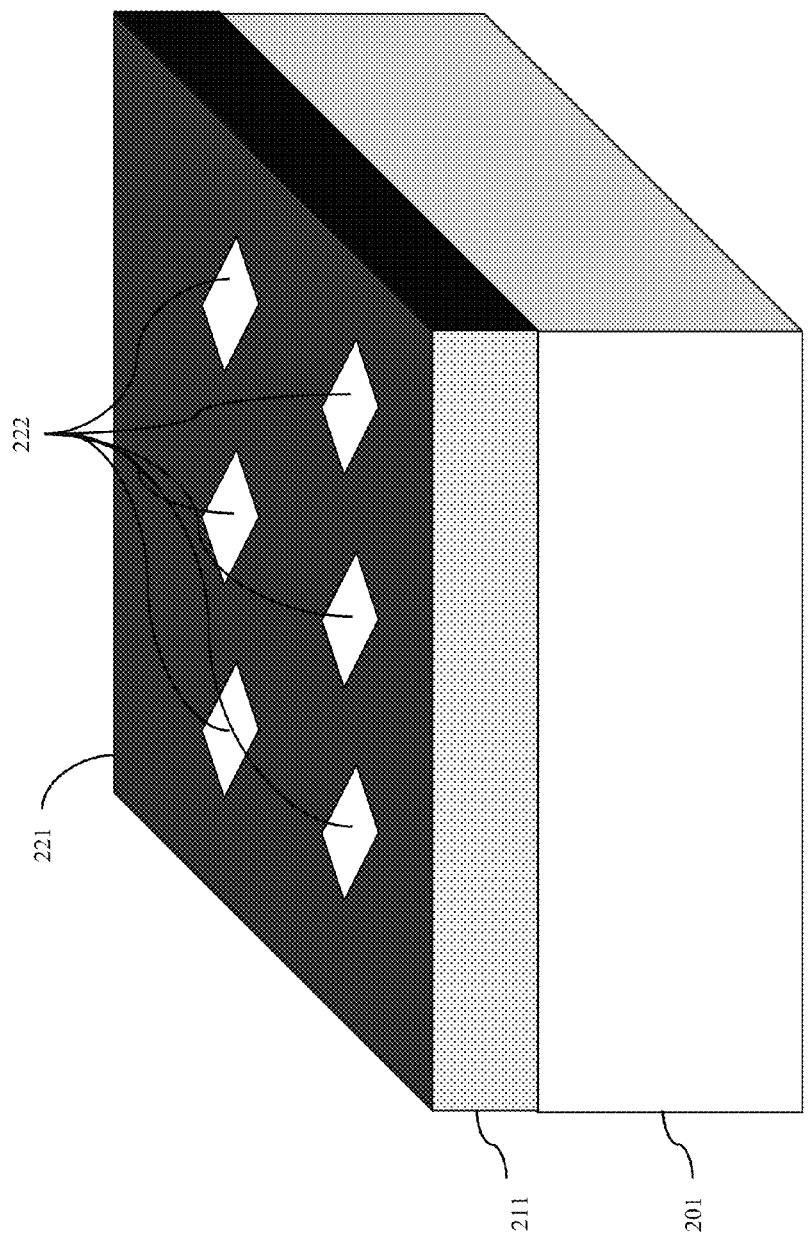
FIG. 10 is a perspective diagram illustrating a first mask layer doped using the masked dopant implantation processes 106 such that the resulting undoped regions have a same size and shape.

Additionally, it should be noted that, if the patterns of the second mask layer 212 and the third mask layer 213 each comprise a plurality of parallel rectangular bodies (e.g., a stripe mask pattern), if these rectangular bodies all have the same width and if the spacing between adjacent bodies is essentially identical, then the resulting undoped regions 222 will each have approximately the same size and shape following the second dopant implantation process 120. For example, as shown in FIG. 9, the undoped regions 222 may all be the same size and square (or rectangular) in shape, particularly when the pattern of the third mask layer 213 was oriented perpendicular to the pattern of the second mask layer 212 (i.e., particularly when the pattern of the third mask layer 213 was oriented such that the exposed second portions 232 were perpendicular to the doped first portions 241 prior to the second dopant implantation process 118). Those skilled in the art will, however, recognize that this shape may change (e.g., to a diamond shape following the second dopant implantation process 118) if the pattern of the third mask layer 213 was not oriented perpendicular to the pattern of the second mask layer 212 (e.g., if the pattern of the third mask layer 213 was oriented such that the exposed second portions 232 were at an angle, such as a 45 degree angle, relative to the doped first portions 241) (see FIG. 10).

Figure 11:
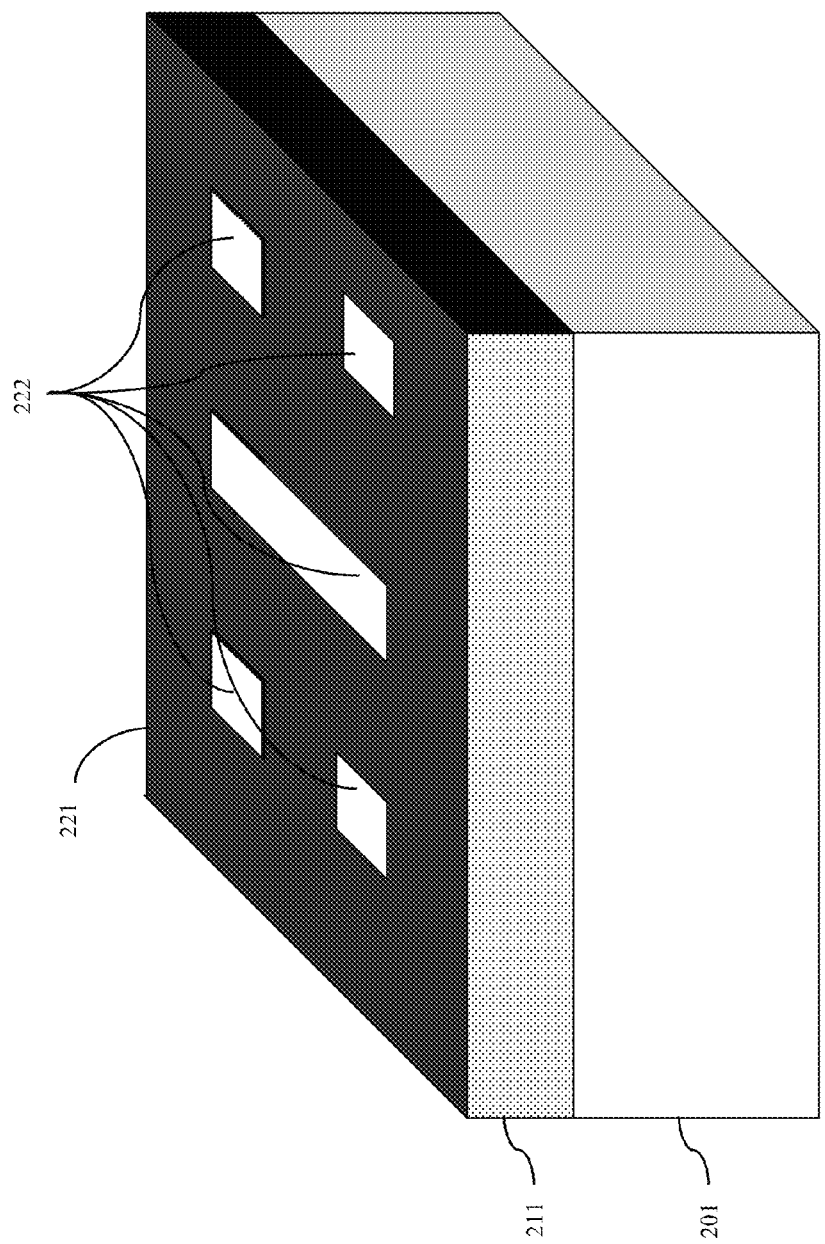
FIG. 11 is a perspective diagram illustrating a first mask layer doped using the masked dopant implantation processes 106 such that at least some of the resulting undoped regions have different sizes and shapes.

Additionally, as mentioned above, the pattern of the second mask layer 212 and/or the pattern of the third mask layer 213 may differ from the patterns illustrated in FIGS. 5 and 7, respectively. For example, the spacing between adjacent bodies in the pattern may differ, the widths of the bodies in the pattern may differ, the bodies in the pattern may be non-parallel, the bodies in the pattern may not be rectangular, the bodies in the pattern may not be continuous (e.g., each rectangular body as shown may be replaced with multiple rectangular bodies that are aligned but spaced apart), etc. If this is the case, some of the resulting undoped regions 222 following the second dopant implantation process 118 may vary in size and/or shape (e.g., see FIG. 11 having both square and rectangular undoped regions 222).

Next, regardless of the sizes and/or shapes of the undoped regions 222 within the doped region 221, either the undoped regions 222 or the doped region 221 can be selectively removed in order to form a mask pattern above the substrate 201 (124). Once the mask pattern is formed, a single etch process can be performed in order to transfer the mask pattern into the substrate 201, thereby forming either openings (e.g., vias or trenches) or mesas (e.g., three dimensional bodies, pillars, bars, etc.) in the substrate 201 (126). For illustration purposes, these processes 124-126 are described in greater detail below and illustrated in the Figures with respect to the first mask layer 211, as shown in FIG. 4 (or FIG. 9), wherein the undoped regions 222 all have approximately the same size and square shape. However, it should be understood that these same processes may similarly applied to the structures shown in FIGS. 10 and 11, wherein the undoped regions 222 have different shape (e.g., a diamond shape) or have different sizes and/or shapes, respectively.

More particularly, in each of the embodiments disclosed herein, either the multiple undoped regions 222 or the doped region 221 of the first mask layer 211 can be selectively removed at process 124. Depending upon whether the undoped regions 222 are removed or the doped region 221 is removed, the resulting mask pattern can be used during a single etch at process 126 to form openings (e.g., vias or trenches) or mesas (e.g., three dimensional bodies, pillars, bars, etc.), respectively, on the substrate 201 at process 126. To optimize the selective removal process, the dopant used in the dopant implantation processes described above can be selected to facilitate either selective removal of the undoped regions over the doped region for subsequent formation of openings (e.g., vias or trenches) in the substrate or selective removal of the doped region for subsequent formation of mesas (i.e., three dimensional bodies, pillars, bars, etc.) in the substrate 201.

Figure 12:
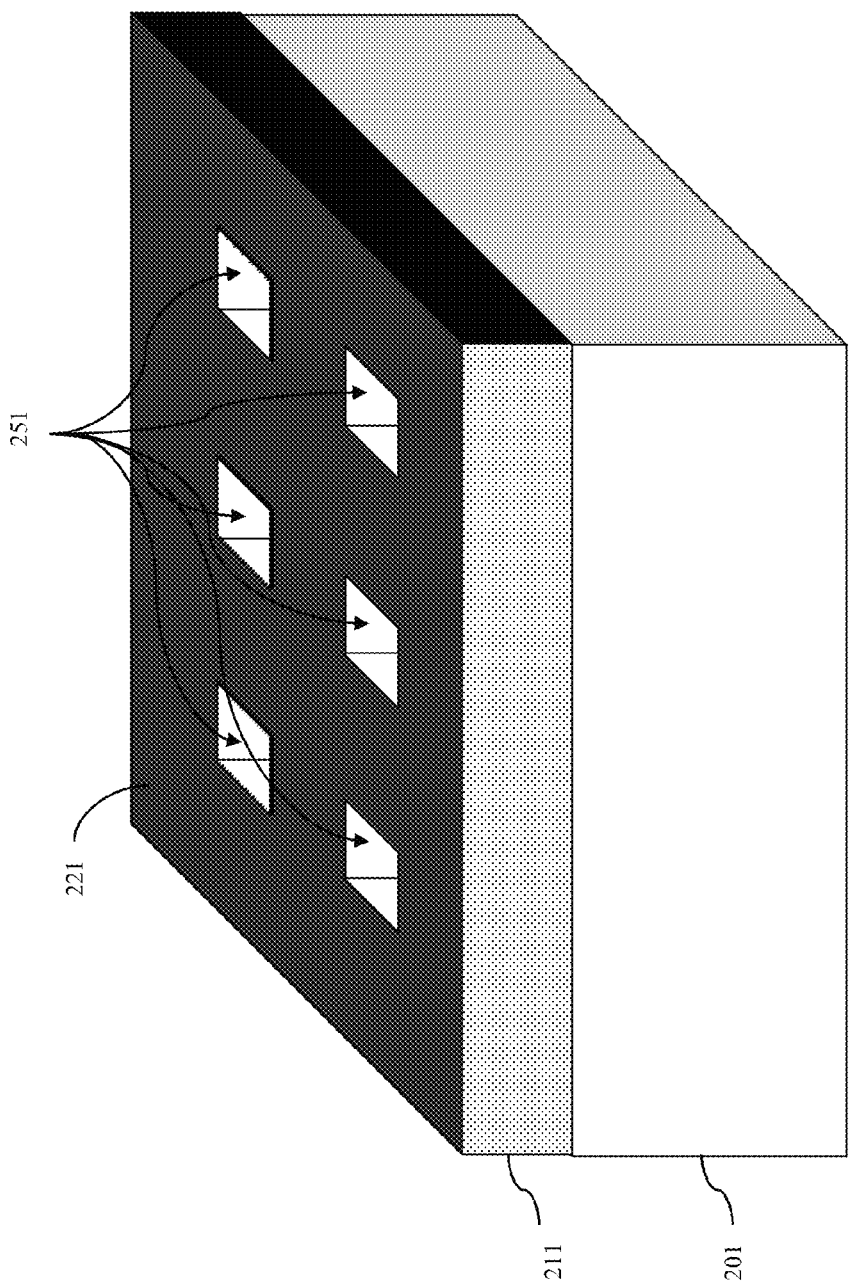
FIG. 12 is a perspective diagram illustrating process 124 and, particularly, selective removal of the undoped regions of the first mask layer, in the patterning method of FIG. 1.

For example, in one embodiment, the patterning method as set forth in the flow diagram of FIG. 1, can comprise providing a substrate 201 at process 102, as discussed in detail above and illustrated in FIG. 2. A first mask layer 211 (e.g., an amorphous or polycrystalline semiconductor layer, such as an amorphous or polycrystalline silicon layer) can be formed (e.g., deposited) on the substrate 201 at process 104, as described in detail above and illustrated in FIG. 3. Then, at least two masked dopant implantation processes 106 can be performed in order to form, within the first mask layer 211, a doped region 221, which laterally surrounds (i.e., defines the outer edges of, borders, etc.) multiple undoped regions 222, as described in detail above and illustrated in FIG. 4. Next, the multiple undoped regions 222 can be selectively removed in order to form a mask pattern with openings 251 above the substrate 201, as described in detail above at process 124 and illustrated in FIG. 12. In this case, the dopant used in the dopant implantation processes 106 to form the doped region 221 should be preselected to ensure that the undoped regions 222 can be selectively etched over the doped region 221. Thus, when the first mask layer 221 comprises amorphous silicon or polycrystalline silicon, boron or xenon can, for example, be preselected as the dopant to be used in the dopant implantation processes 106 because undoped silicon can be readily selectively etched over boron-doped or xenon-doped silicon. For example, a wet etch, such as ammonia or TetraMethyl Ammonium Hydroxide (TMAH) etch, can be used to etch undoped silicon so that it can be removed selective to boron-doped or xenon-doped silicon.

Figure 13:
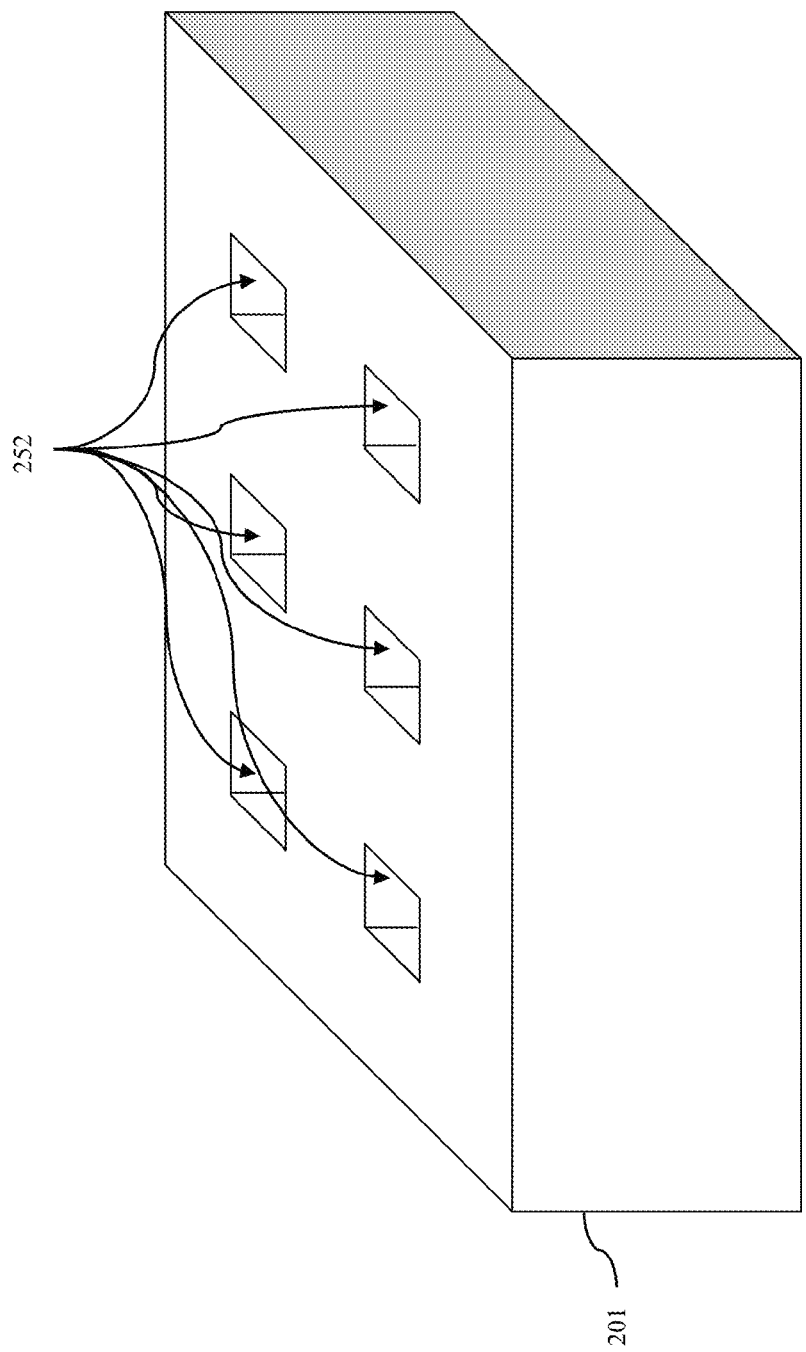
FIG. 13 is a perspective diagram illustrating process 126 in the patterning method of FIG. 1 so as to form openings (e.g., vias or trenches) in the substrate.

Once the mask pattern with the openings 251 is formed, a single etch process can be performed in order to transfer the mask pattern into the substrate 201, thereby forming openings (e.g., vias) 252 in the substrate 201 and the mask pattern can be removed (126, see FIG. 13). This single etch process can be pre-selected based on the material of the substrate 201 and the desired shape of the openings 252 to be formed within the substrate 201. Various different etch processes that are suitable for forming openings within a dielectric, conductor or semiconductor substrate with the assistance of a mask pattern are well known in the art and, thus, the details of such etch processes are omitted from this specification in order to allow the reader to focus on the salient aspects of the embodiment.

Figure 14:
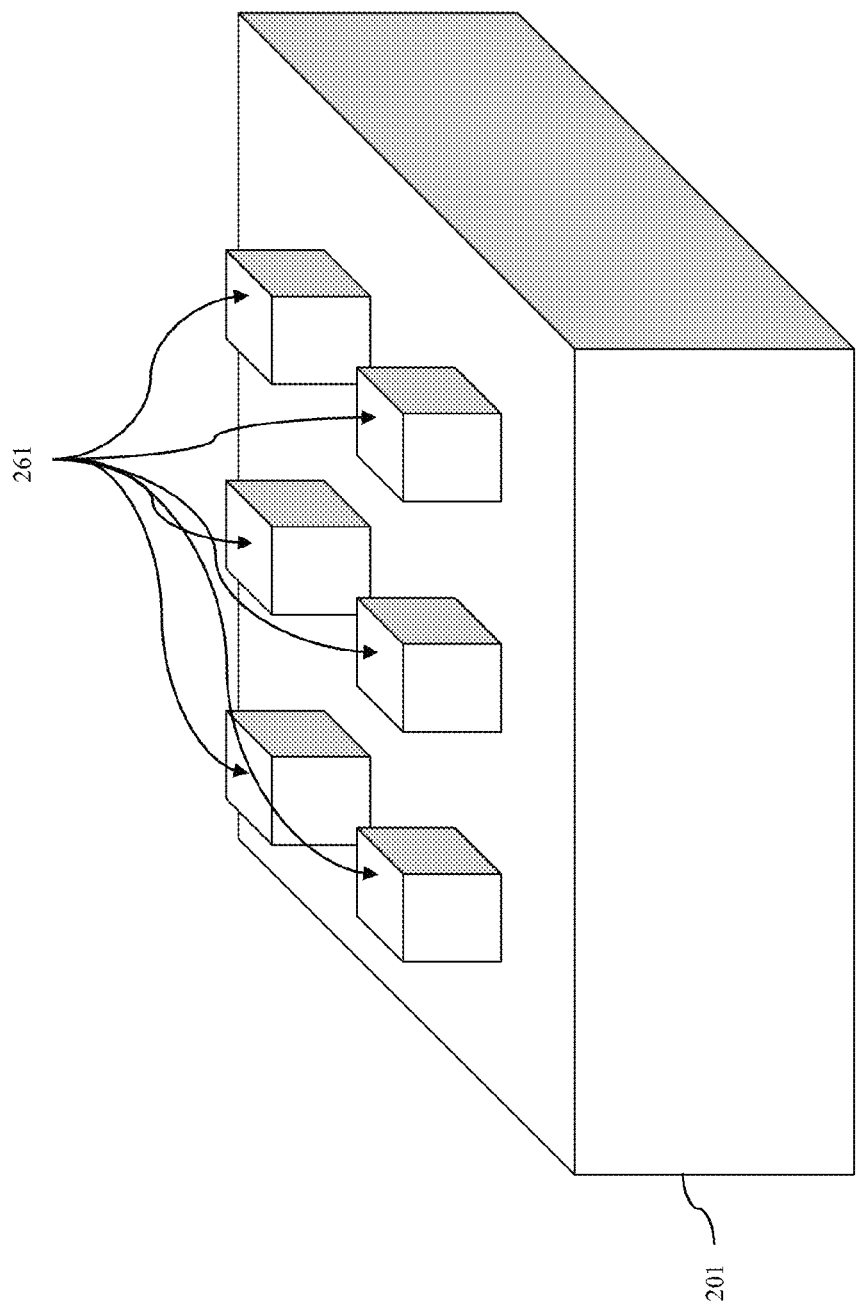
FIG. 14 is a perspective diagram illustrating process 124 and, particularly, selective removal of the doped region of the first mask layer, in the patterning method of FIG. 1.

In another embodiment, the patterning method as set forth in the flow diagram of FIG. 1, can comprise providing a substrate 201, as discussed in detail above and illustrated in FIG. 2. A first mask layer 211 (e.g., an amorphous or polycrystalline semiconductor layer, such as an amorphous or polycrystalline silicon layer) can be formed on the substrate 201 at process 104, as described in detail above and illustrated in FIG. 3. Then, at least two masked dopant implantation processes 106 can be performed in order to form, within the first mask layer 211, a doped region 221, which laterally surrounds (i.e., defines the outer edges of, borders, etc.) multiple undoped regions 222, as described in detail above and illustrated in FIG. 4. Next, the doped region 221 can be selectively removed in order to form a mask pattern with discrete mask bodies 261 above the substrate 201, as described in detail above at process 124 and illustrated in FIG. 14. In this case, the dopant used in the dopant implantation processes 106 to form the doped region 221 should be preselected to ensure that the doped region 221 can be selectively etched over the undoped regions 222. Thus, when the first mask layer 211 comprises amorphous silicon or polycrystalline silicon, arsenic or phosphorous can be preselected as the dopant to be used in the dopant implantation processes 106 because arsenic-doped or phosphorous-doped silicon can be readily selectively etched over undoped silicon. For example, a dry etch, such as plasma etch with a gas mixture of CF4, O2, C12, and/or HBr, can be used to etch phosphorus-doped or arsenic-doped silicon so that it can be removed selective to undoped silicon.

Figure 15:
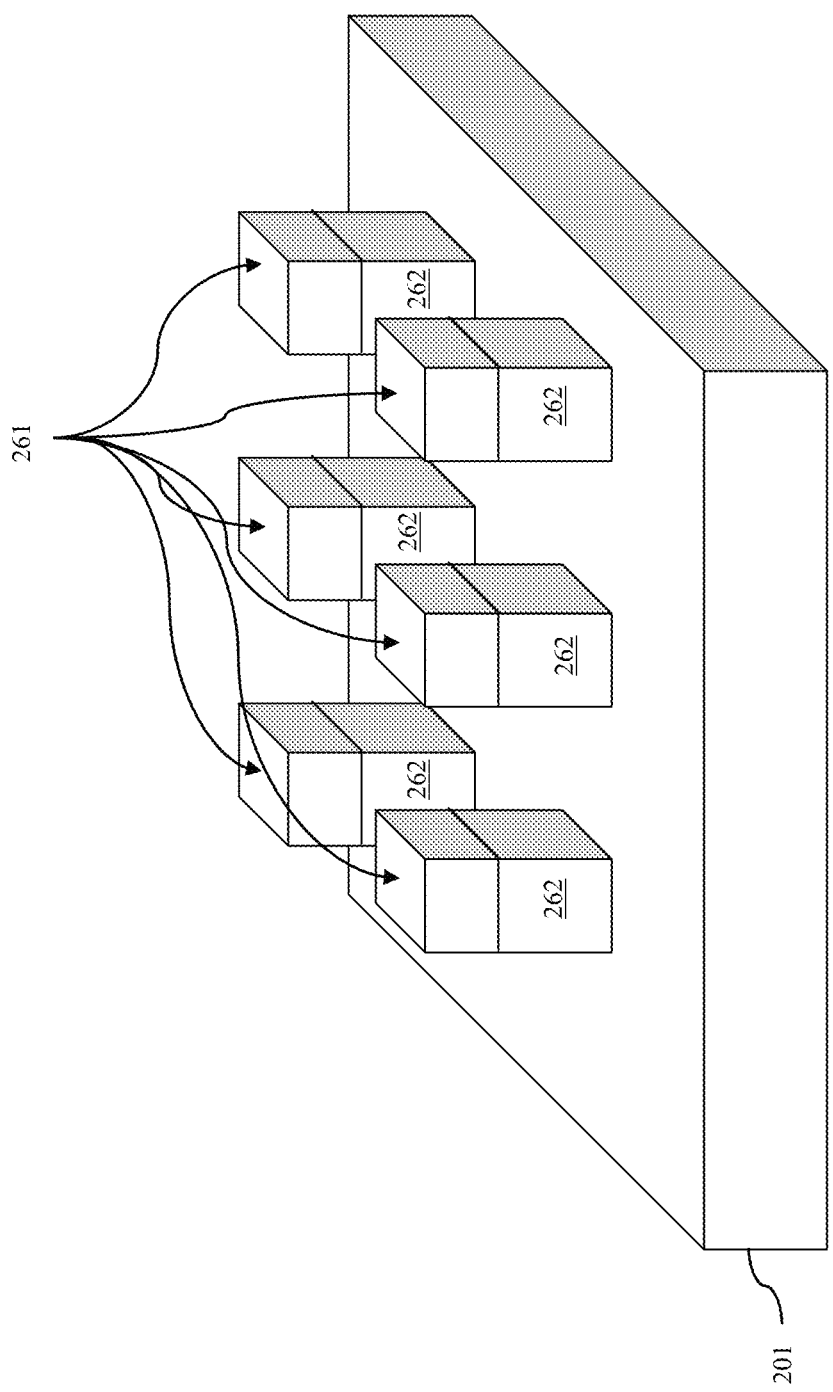
FIG. 15 is a perspective diagram illustrating process 126 in the patterning method of FIG. 1 so as to form mesas in the substrate.
Figure 16:
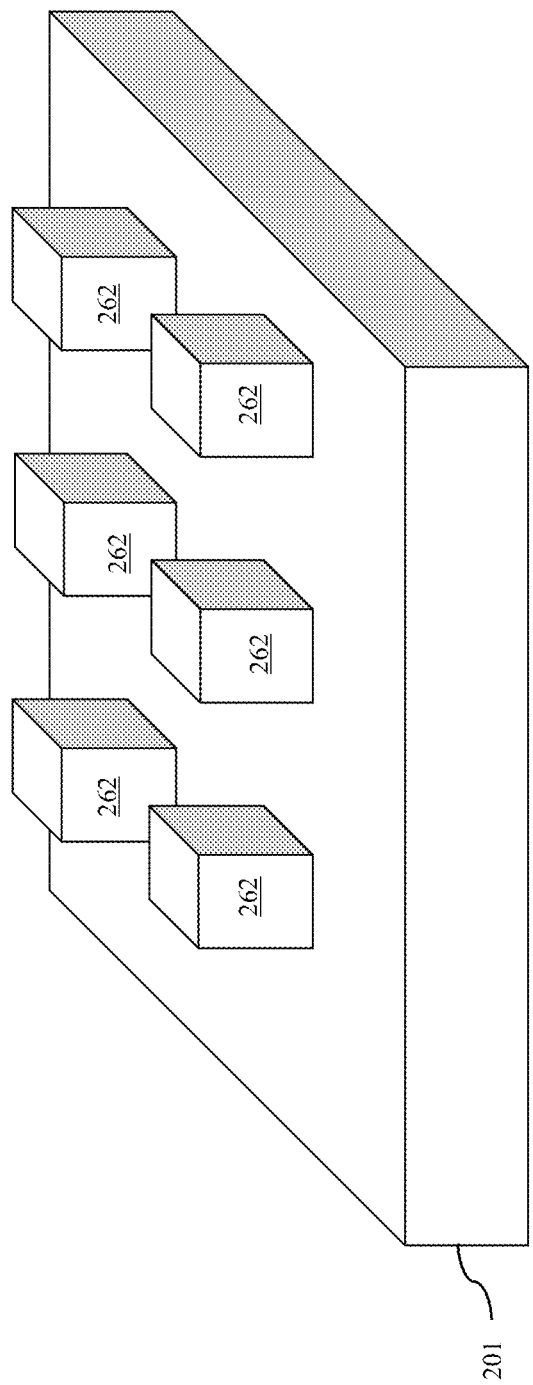
FIG. 16 is a perspective diagram illustrating the mesas of FIG. 15 following removal of the remaining undoped regions of the first mask layer.

Once the mask pattern with the discrete mask bodies 261 is formed, a single etch process can be performed in order to transfer the mask pattern into the substrate 201, thereby forming, in the substrate, mesas 262 (i.e., three-dimensional bodies, pillars, bars, etc.) having the same shapes as the discrete mask bodies and the mask pattern can be removed (126, see FIGS. 15-16). It should be noted that, as illustrated, this etch process can be performed so that the mesas 262 are formed only in the upper portion of the substrate 201. However, it should be understood that, alternatively, the etch process can stop at any desired point within the substrate 201 including, but not limited to, the bottom surface of the substrate 201. This single etch process can be pre-selected based on the material of the substrate 201 and the desired shape of the mesa sidewalls (e.g., vertical (as illustrated), angled, tapered, etc.). Various different etch processes that are suitable for forming such mesas from a dielectric, conductor or semiconductor substrate with the assistance of a mask pattern are well known in the art and, thus, the details of such etch processes are omitted from this specification in order to allow the reader to focus on the salient aspects of the embodiment.

Also disclosed herein are embodiments of a computer program product. This computer program product can comprise a computer-readable medium having computer-readable program code embodied therewith. The computer-readable program code can comprise instructions that, when executed by a computer, control the manufacturing equipment (e.g., lithography equipment, implantation chambers, etch chambers, etc.) used in the manufacturing of integrated circuits and, more specifically, cause such manufacturing equipment to perform the above-described method.

More particularly, any combination of one or more computer-readable medium(s) may be utilized. The computer-readable medium may be a computer-readable storage medium and, thereby, non-transitory, or may be a computer-readable signal medium. A computer-readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device. A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing. Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described above with reference to flowchart illustrations and/or block diagrams of methods, apparatus (systems) and computer program products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 17:
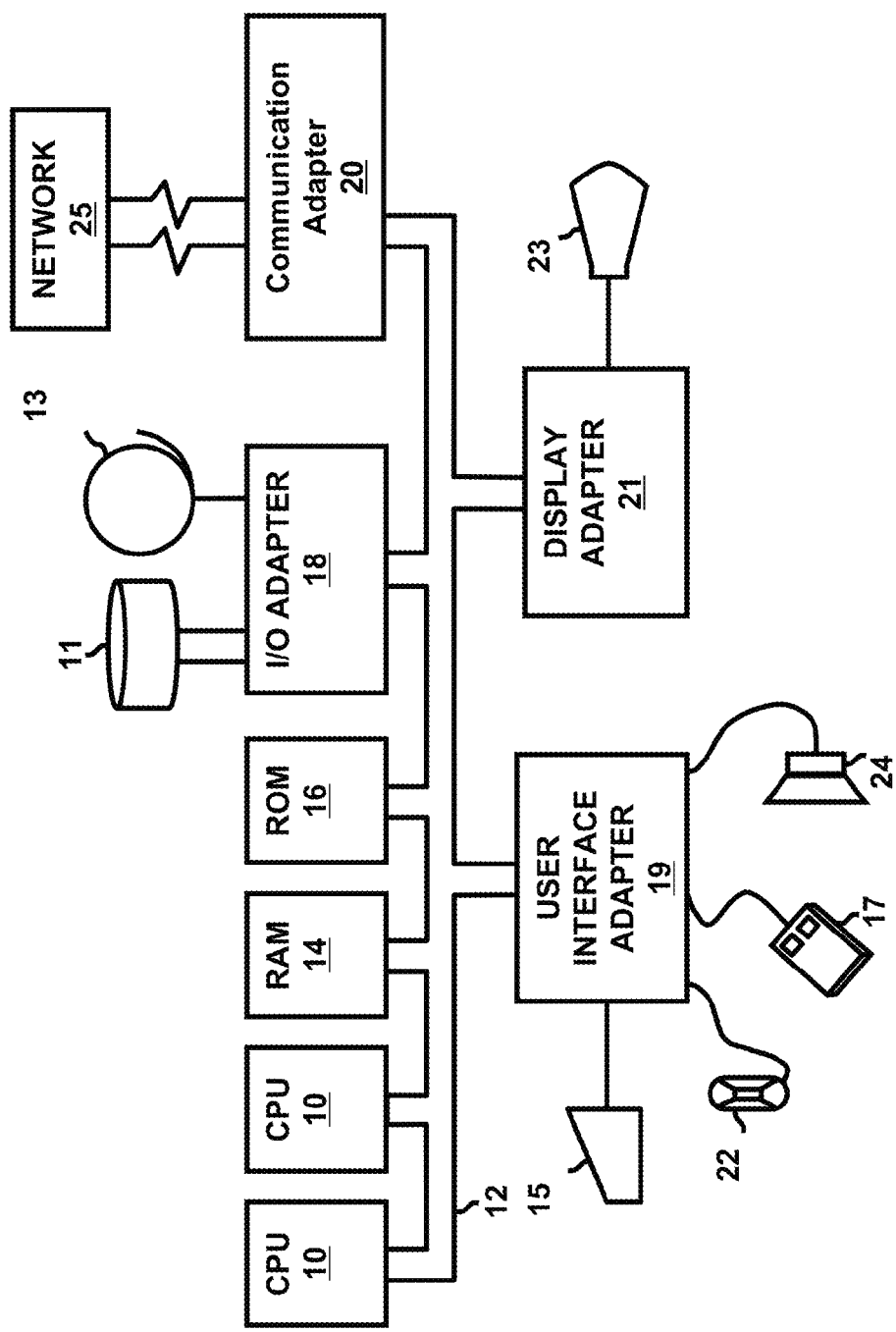
FIG. 17 is representative hardware environment that can be used to execute the computer program code that controls the manufacturing equipment used in the performance of the patterning method of FIG. 1.

A representative hardware environment for executing the computer program code, as described in detail above, is depicted in FIG. 17. This schematic drawing illustrates a hardware configuration of an information handling/computer system. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowchart and block diagrams in the Figures illustrate the architecture, functionality, and operation of possible implementations of methods and computer program products according to various embodiments disclosed. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be understood that as used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description of the disclosed embodiments has been presented for purposes of illustration and is not intended to be exhaustive. Many modifications and variations will be apparent to those of ordinary skill in the art without departing from the scope and spirit of the disclosed embodiments.

Therefore, disclosed above are embodiments of an improved double patterning method for forming openings (e.g., vias or trenches) or mesas on a substrate. This method avoids the wafer topography effects seen in prior art double patterning techniques by ensuring that the substrate itself is only subjected to a single etch process. Specifically, in the embodiments disclosed herein, a first mask layer is formed on the substrate and subjected to multiple masked implantation processes such that it has a doped region and multiple undoped regions within (i.e., defined by) the doped region. Then, either the undoped regions or the doped region can be selectively removed in order to form a mask pattern above the substrate. Once the mask pattern is formed, an etch process can be performed to transfer the mask pattern into the substrate. Depending upon whether the undoped regions are removed or the doped region is removed, the mask pattern will form openings (e.g., vias or trenches) or mesas, respectively, on the substrate.

The advantage of the above-described embodiments is that, the substrate surface remains planar during the masked implantation processes and, thus, issues regarding topography effects are avoided.

What is claimed is:

1. A patterning method comprising:
   forming a first mask layer on a substrate;
   performing at least two dopant implantation processes using at least two additional mask layers to form, within said first mask layer, a doped region that comprises said dopant and that laterally surrounds multiple undoped regions, each undoped region having a shape with four sides and being laterally surrounded by said doped region such that each of said four sides is immediately adjacent to said doped region, said performing of said at least two dopant implantation processes using said at least two additional mask layers comprising:
      forming a second mask layer on said first mask layer, said second mask layer being patterned into a stripe mask pattern so that first portions of said first mask layer are exposed;
      doping said first portions with said dopant;
      removing said second mask layer;
      forming a third mask layer on said first mask layer, said third mask layer being patterned into an additional stripe mask pattern oriented at a different angle than said stripe mask pattern such that second portions of said first mask layer, which traverse said first portions, are exposed;
      doping said second portions with said dopant such that said first portions and said second portions in combination form said doped region that comprises said dopant and that laterally surrounds said multiple undoped regions; and,
      removing said third mask layer;
   selectively removing said doped region to form a mask pattern above said substrate; and,
   performing an etch process to transfer said mask pattern into said substrate to form multiple discrete features having said shape in said substrate,
   said dopant comprising phosphorous.

2. The patterning method of claim 1, said stripe mask pattern and said additional stripe mask pattern each comprising a plurality of parallel rectangular-shaped bodies and said parallel rectangular-shaped bodies having identical dimensions and spacing in said stripe mask pattern and said additional stripe mask pattern such that, following said doping of said first portions and said doping of said second portions, said multiple undoped regions each have said shape and a same size.

3. The patterning method of claim 1, said stripe mask pattern and said additional stripe mask pattern each comprising a plurality of parallel rectangular-shaped bodies and said parallel rectangular-shaped bodies having any one of varied dimensions and varied spacing in said stripe mask pattern and said additional stripe mask pattern such that, following said doping of said first portions and said doping of said second portions, at least some of said undoped regions have different sizes.

4. The patterning method of claim 1, said additional stripe mask pattern being formed such that said second portions are perpendicular to said first portions.

5. The patterning method of claim 1, said first mask layer comprising any one of an amorphous semiconductor layer and a polycrystalline semiconductor layer.

6. The patterning method of claim 1, said substrate comprising any one of a dielectric, a conductor and a semiconductor.

7. A patterning method comprising:
   forming a first mask layer on a substrate;
   performing at least two dopant implantation processes using at least two additional mask layers to form, within said first mask layer, a doped region that comprises a dopant and that laterally surrounds multiple undoped regions, each undoped region having a shape with four sides and being laterally surrounded by said doped region such that each of said four sides is immediately adjacent to said doped region and said performing of said at least two dopant implantation processes using said at least two additional mask layers comprising:
      forming a second mask layer on said first mask layer, said second mask layer being patterned into a stripe mask pattern such that first portions of said first mask layer are exposed;
      doping said first portions with said dopant;
      removing said second mask layer;
      forming a third mask layer on said first mask layer, said third mask layer being patterned into an additional stripe mask pattern oriented at an angle of less than 90 degrees relative to than said stripe mask pattern such that second portions of said first mask layer, which traverse said first portions, are exposed;
      doping said second portions with said dopant such that said first portions and said second portions in combination form said doped region that comprises said dopant and that laterally surrounds said multiple undoped regions and such that said multiple undoped regions each have a diamond shape; and,
removing said third mask layer;
selectively removing one of said doped region and said multiple undoped regions to form a mask pattern above said substrate; and,
performing an etch process to transfer said mask pattern into said substrate.

8. A patterning method comprising:
forming a first mask layer on a substrate;
performing at least two dopant implantation processes using at least two additional mask layers to form, within said first mask layer, a doped region that comprises a dopant and that laterally surrounds multiple undoped regions, each undoped region having a shape with four sides and being laterally surrounded by said doped region such that each of said four sides is immediately adjacent to said doped region, said performing of said at least two dopant implantation processes using said at least two additional mask layers comprising:
  forming a second mask layer on said first mask layer, said second mask layer being patterned into a stripe mask pattern such that first portions of said first mask layer are exposed;
  doping said first portions with said dopant;
  removing said second mask layer;
  forming a third mask layer on said first mask layer, said third mask layer being patterned into an additional stripe mask pattern oriented at a different angle than said stripe mask pattern such that second portions of said first mask layer, which traverse said first portions, are exposed;
  doping said second portions with said dopant such that said first portions and said second portions in combination form said doped region that comprises said dopant and that laterally surrounds said multiple undoped regions, said stripe mask pattern and said additional stripe mask pattern each comprising a plurality of parallel rectangular-shaped bodies and said parallel rectangular-shaped bodies having any one of varied dimensions and varied spacing in said stripe mask pattern and said additional stripe mask pattern such that, following said doping of said first portions and said doping of said second portions, at least some of said undoped regions have different sizes; and,
  removing said third mask layer;
selectively removing said multiple undoped regions to form a mask pattern above said substrate; and,
performing an etch process to transfer said mask pattern into said substrate so as to form multiple discrete openings having said shape and said different sizes in said substrate, said dopant comprising Xenon.

9. The patterning method of claim 8, said first mask layer comprising any one of amorphous silicon and polycrystalline silicon.

10. The patterning method of claim 8, said additional stripe mask pattern being formed such that said second portions are perpendicular to said first portions.

11. The patterning method of claim 8, said substrate comprising any one of a dielectric, a conductor and a semiconductor.

12. A patterning method comprising:
forming a first mask layer on a substrate, said substrate comprising a conductor layer;
performing at least two dopant implantation processes using at least two additional mask layers to form, within said first mask layer, a doped region that comprises a dopant and that laterally surrounds multiple undoped regions, each undoped region having a shape with four sides and being laterally surrounded by said doped region such that each of said four sides is immediately adjacent to said doped region, said performing of said at least two dopant implantation processes using said at least two additional mask layers comprising:
  forming a second mask layer on said first mask layer, said second mask layer being patterned into a stripe mask pattern such that first portions of said first mask layer are exposed;
  doping said first portions with said dopant;
  removing said second mask layer;
  forming a third mask layer on said first mask layer, said third mask layer being patterned into an additional stripe mask pattern oriented at a different angle than said stripe mask pattern such that second portions of said first mask layer, which traverse said first portions, are exposed;
  doping said second portions with said dopant such that said first portions and said second portions in combination form said doped region that comprises said dopant and that laterally surrounds said multiple undoped regions; and,
  removing said third mask layer;
selectively removing said doped region to form a mask pattern above said substrate; and
performing an etch process to transfer said mask pattern into said substrate so as to form multiple discrete nanowires having said shape in said conductor layer,
said first mask layer comprising any one of amorphous silicon and polycrystalline silicon and said dopant comprising any of arsenic and phosphorous.

13. The patterning method of claim 12, said stripe mask pattern and said additional stripe mask pattern each comprising a plurality of parallel rectangular-shaped bodies and said parallel rectangular-shaped bodies having identical dimensions and spacing in said stripe mask pattern and said additional stripe mask pattern such that, following said doping of said first portions and said doping of said second portions, said undoped regions each have said shape and a same size.

14. The patterning method of claim 12, said stripe mask pattern and said additional stripe mask pattern each comprising a plurality of parallel rectangular-shaped bodies and said parallel rectangular-shaped bodies having any one of varied dimensions and varied spacing in said stripe mask pattern and said additional stripe mask pattern such that, following said doping of said first portions and said doping of said second portions, at least some of said undoped regions have different sizes.

15. The patterning method of claim 12, said additional stripe mask pattern being formed such that said second portions are perpendicular to said first portions.

16. The patterning method of claim 12, said second mask layer and said third mask layer being patterned using lithographic patterning techniques.

17. The patterning method of claim 12, said second mask layer and said third mask layer comprising photoresist layers.

18. The patterning method of claim 12, said second mask layer and said third mask layer being patterning using sidewall image transfer patterning techniques.

19. The patterning method of claim 12, said second mask layer and said third mask layer comprising dielectric layers.

* * * * *